US006407615B2

(12) United States Patent
Main et al.

(10) Patent No.: US 6,407,615 B2
(45) Date of Patent: *Jun. 18, 2002

(54) TEMPERATURE COMPENSATION CIRCUIT AND METHOD OF COMPENSATING

(75) Inventors: William E. Main, Mesa; Danielle L. Coffing, Tempe, both of AZ (US)

(73) Assignee: Motorola, Inc., Schaumburg, IL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/549,837

(22) Filed: Apr. 14, 2000

(51) Int. Cl.[7] .............................................. H01L 35/00

(52) U.S. Cl. ....................................... 327/513; 327/538

(58) Field of Search ................................ 327/513, 362, 327/419, 538; 323/312, 313, 314, 315

(56) References Cited

U.S. PATENT DOCUMENTS

| | | | | | |
|---|---|---|---|---|---|
| 4,507,573 | A | * | 3/1985 | Nagano | 327/542 |
| 5,038,053 | A | * | 8/1991 | Djenguerian et al. | 327/513 |
| 5,399,914 | A | * | 3/1995 | Brewster | 327/538 |
| 5,446,368 | A | * | 8/1995 | Uscategui | 323/315 |
| 5,604,427 | A | * | 2/1997 | Kimura | 323/313 |
| 5,754,038 | A | * | 5/1998 | Durec et al. | 323/313 |
| 6,051,966 | A | * | 4/2000 | Pontarollo | 323/315 |
| 6,163,216 | A | * | 12/2000 | Murray et al. | 330/255 |

* cited by examiner

*Primary Examiner*—Toan Tran
*Assistant Examiner*—Hai L. Nguyen

(57) ABSTRACT

A temperature compensation circuit converts a control signal ($I_G$) that has an undesirable temperature coefficient to a temperature compensated control signal ($I_{32}$) having a desirable temperature coefficient. In one embodiment, four transistors (60, 64, 68, and 72) are configured to convert the control signal ($I_G$) having an undesirable temperature coefficient to the temperature compensated control signal ($I_{32}$) having the desired temperature coefficient. Additional embodiments use components to refine the temperature compensation process.

6 Claims, 2 Drawing Sheets

TEMPERATURE COMPENSATION CIRCUIT AND METHOD OF COMPENSATING

In general, this invention relates to a temperature compensation circuit. Specifically, this invention provides for a temperature compensation circuit and method that controls the temperature coefficient of an output signal.

Temperature compensation is often employed in situations where a control signal provided by another semiconductor device or circuit has a particular temperature coefficient and the control signal needs to be converted to a different temperature coefficient. For example, in a typical Radio Frequency (RF) application, a gain control signal is produced by a microprocessor. This gain control signal typically has an undesirable temperature coefficient, in that the gain control curve, e.g. voltage versus decibels, is subject to unwanted anomalies with temperature variation.

Prior art temperature compensation circuits, particularly those found in cellular or cordless phones, are typified by the presence of Metal Oxide Semiconductor Field Effect Transistors (MOSFET) and an operational amplifier connected to a reference voltage for controlling the transfer characteristics of gain control input over temperature. These types of prior art circuits typically use voltage to current converters, where the reference and input voltages have an undesirable temperature coefficient and the reference and output currents have a desired temperature coefficient. One drawback of the prior art temperature compensation circuits is that the transfer characteristic does not produce a sufficiently linear result. Furthermore, the transfer characteristic produces a gain control curve where the minimum voltage is the threshold voltage ($V_T$) of the MOSFET device, not zero. This is undesirable because the full control range is limited due to the threshold voltage. Also, the requirement for the operational amplifier adds complexity and cost to the circuit.

Therefore, a need exists to provide a temperature compensation circuit that produces an approximately linear output signal that is capable of a full range of control.

DETAILED DESCRIPTION OF THE DRAWINGS

Bipolar circuits have transistor base-emitter voltages and, in particular, base-emitter voltage differences that are Proportional To Absolute Temperature (PTAT). The present invention provides a circuit and method for interfacing a bipolar circuit to an external circuit having a different temperature coefficient.

Figure 1:
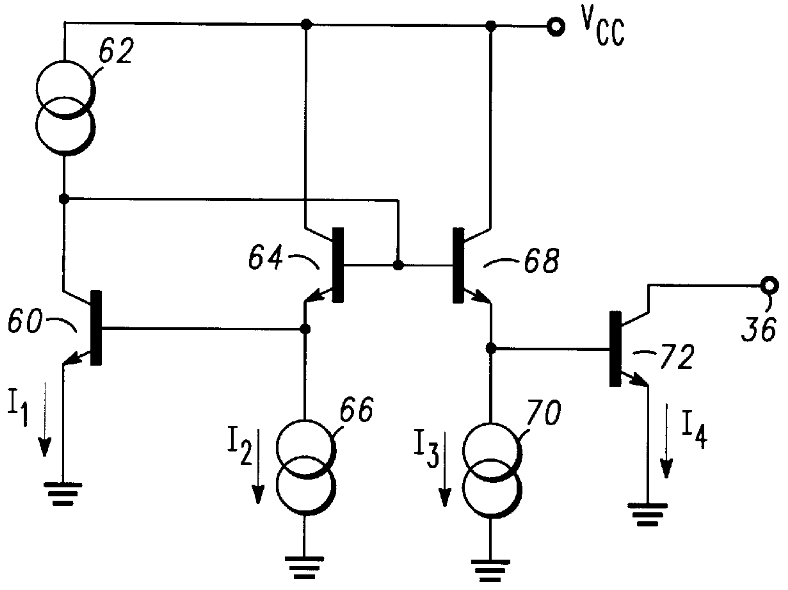
FIG. 1 is a circuit diagram of a temperature compensation circuit.

FIG. 1 illustrates a four transistor model of a temperature compensation circuit. A current source 62 is connected between a power conductor that receives a voltage $V_{cc}$ and the collector of a transistor 60, where current source 62 provides an input current. The emitter of transistor 60 is connected to a power conductor that receives ground potential. The base of transistor 60 is connected to an emitter of a transistor 64. Transistor 60 conducts a current $I_1$, which is the input signal having an undesirable temperature coefficient.

Transistor 64 has a collector connected to the power conductor that receives the voltage $V_{cc}$ and an emitter connected through a current source 66 to the power conductor that receives ground potential. Current source 66 provides a current $I_2$ having the desired temperature coefficient. The base of transistor 64 and the base of a transistor 68 are connected to each other and further connected to the collector of transistor 60. The collector of transistor 68 is connected to the power conductor that receives the voltage $V_{cc}$ and an emitter connected through a current source 70 to the power conductor that receives ground potential. Current source 70 provides a current $I_3$, which is a function of current $I_2$. Current $I_3$ has the same undesirable temperature coefficient as current $I_1$. A transistor 72 has a base connected to the emitter of transistor 68, an emitter connected to the power conductor that receives ground potential, and a collector connected to an output terminal. Transistor 72 conducts a current $I_4$, which is a function of the current $I_1$ and has a desired temperature coefficient. Thus, the current supplied by transistor 72 at the output terminal is the temperature compensated output signal.

In operation, temperature compensation circuit operates as follows. The circuit voltages are a function of the transistor base-emitter voltages ($V_{BE}$) and, more particularly, the $V_{BE}$ of each transistor in relation to other transistors. Summing the $V_{BE}$ for the transistors results in the following relationship:

$$V_{BE60}+V_{BE64}=V_{BE68}+V_{BE72}, \quad \text{(Equation 1)}$$

where $V_{BE60}$ is the $V_{BE}$ of transistor 60, $V_{BE64}$ is the $V_{BE}$ of transistor 64, $V_{BE68}$ is the $V_{BE}$ of transistor 68, and $V_{BE72}$ is the $V_{BE}$ of transistor 72. Note that $V_{BE}$ is equal to (kT/q) * In($I_c/I_s$), where kT/q is the thermal voltage of the device, current $I_c$ is the relevant collector current, and current $I_s$ is the saturation current of the transistor. Thus, converting equation 1 to currents, the product of the current $I_1$ and the current $I_2$ is equal to the product of current $I_3$ and the current $I_4$.

$$I_1*I_2=I_3*I_4 \quad \text{(Equation 2)}$$

where $I_1$ is the current conducted by transistor 60, $I_2$ is the current conducted by transistor 64, $I_3$ is the current conducted by transistor 68, and $I_4$ is the current conducted by transistor 72.

Isolating for the temperature compensated output current $I_4$ yields the following:

$$I_4=(I_1*I_2)/I_3 \quad \text{(Equation 3)}$$

Current $I_2$ was chosen with a desirable temperature coefficient. Currents $I_2$ and $I_3$ are chosen to be nominally equal at a known temperature. Current $I_1$ has an undesirable temperature coefficient that is canceled by the undesirable temperature coefficient for the current $I_3$ (see equation 3). Thus, current $I_4$ supplied at output terminal 36 is equal to the current $I_1$, but whereas input current $I_1$ has an undesirable temperature coefficient, output current $I_4$ has the desirable temperature coefficient. Furthermore, current ratios other than 1:1 between currents $I_4$ and $I_1$ are possible by simply providing an alternate ratio for currents $I_2$ and $I_3$ as, for example, changing the physical dimensions of the transistor emitter areas with respect to each other. It should be noted that currents $I_1$ and $I_2$ are interchangeable, where current $I_1$ is the input signal and current $I_2$ is chosen with the desirable temperature coefficient.

Figure 2:
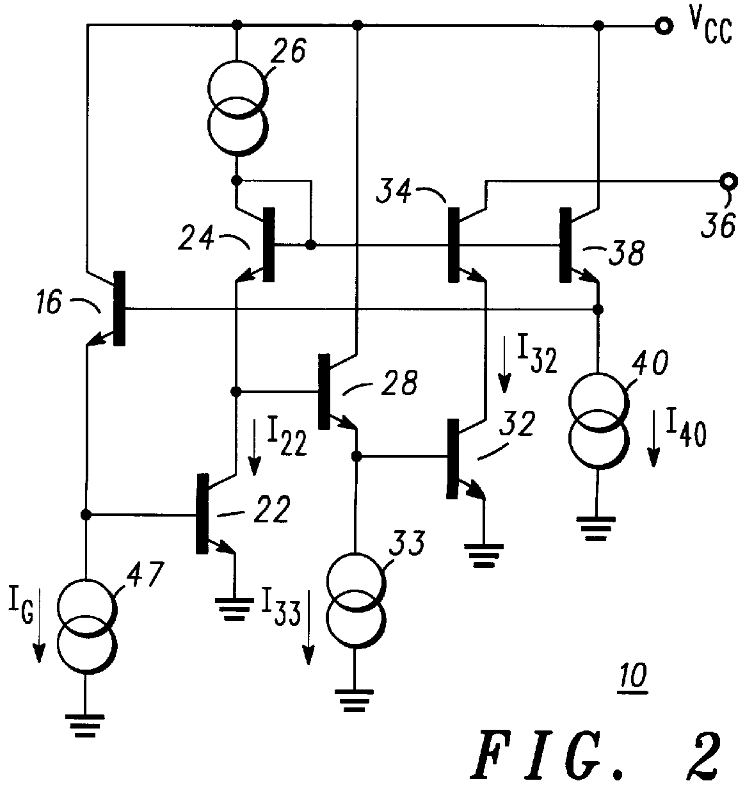
FIG. 2 is a circuit diagram of another embodiment of the temperature compensation circuit.

FIG. 2 illustrates another embodiment of a temperature compensation circuit. In this embodiment, a current source 47 supplies a current $I_G$ to the emitter of a transistor 16 and to the base of a transistor 22. The collector of transistor 16 is connected to a power conductor that receives a voltage $V_{cc}$. The collector of transistor 22 is connected to an emitter of a transistor 24 and further connected to a base of a transistor 28. The base and collector of transistor 24 are connected through a current source 26 to the power conductor that receives a voltage $V_{cc}$. The collector of transistor 28 is connected to the power conductor that receives the voltage $V_{cc}$. The emitter of transistor 28 is connected to the base of a transistor 32 and to the power conductor that receives the ground potential through a current source 33. The collector of transistor 32 is connected to an emitter of a transistor 34. The collector of transistor 34 is connected to a temperature compensated output terminal 36. The base terminals of transistors 34 and 38 are connected to the base of transistor 24. The collector of transistor 38 is connected to the power conductor that receives the voltage $V_{cc}$. The emitter of transistor 38 is connected through a current source 40 to the power conductor that receives the ground potential and to the base of transistor 16. It should be pointed out that transistor 34 may be removed from the circuit configuration.

The equations from above are modified consistent with the operation of the temperature compensation circuit. Summing the $V_{BE}$ for transistors 32, 28, 24, 38, 16, and 22 results in the following:

$$V_{BE32}+V_{BE28}+V_{BE24}=V_{BE38}+V_{BE16}+V_{BE22} \quad \text{(Equation 4)}$$

where $V_{BE32}$ is the base-emitter voltage of transistor 32, $V_{BE28}$ is the base-emitter voltage of transistor 28, $V_{BE24}$ is the base-emitter voltage of transistor 24, $V_{BE38}$ is the base-emitter voltage of transistor 38, $V_{BE16}$ is the base-emitter voltage of transistor 16, and $V_{BE22}$ is the base-emitter voltage of transistor 22. Transistors 22 and 24 conduct the same current and, therefore, the $V_{BE22}$ of transistor 22 is the same as the $V_{BE24}$ of transistor 24 because transistors 22 and 24 share the same current $I_{22}$. Thus, equation 4 is simplified to:

$$V_{BE32}+V_{BE28}=V_{BE38}+V_{BE16} \quad \text{(Equation 5)}$$

The currents for transistors 32, 28, 38, and 16 can be represented by the product of currents $I_{32}$ and $I_{28}$ being equal to the product of currents $I_{38}$ and $I_{16}$.

$$I_{32}*I_{28}=I_{38}*I_{16}, \quad \text{(Equation 6)}$$

where $I_{32}$ is the current conducted by transistor 32, $I_{28}$ is the current conducted by transistor 28, $I_{38}$ is the current conducted by transistor 38, and $I_{16}$ is the current conducted by transistor 16.

Isolating for current $I_{32}$, i.e., the temperature compensated output current, provides the following equation.

$$I_{32}=(I_{38}*I_{16})/I_{28} \quad \text{(Equation 7)}$$

In the preferred embodiment, transistors 16, 38, 28, 32, 24, and 22 are bipolar transistors with similar sizing. Transistors 16, 38, 28, and 32 are devices used in the basic operation of the circuit as described above in FIG. 1, while transistors 22 and 24 are included to improve the performance of the temperature compensation circuit.

This embodiment produces a temperature compensated output current at terminal 36 that is a function of the variable input current $I_G$, but with a different temperature coefficient. By way of example, current $I_G$ may be received as a PTAT current but desired as having a zero temperature coefficient. The temperature compensation circuit illustrated in FIG. 2 converts the input PTAT current $I_G$ to an output current $I_{32}$ having the zero temperature coefficient. In this embodiment, current $I_{40}$ is chosen as having a zero temperature coefficient and the output current $I_{32}$ will have the same temperature coefficient as the current $I_{40}$. Thus, the current $I_{32}$ supplied at output terminal 36 is equal to current $I_G$ at a given temperature, but having a zero temperature coefficient.

Figure 3:
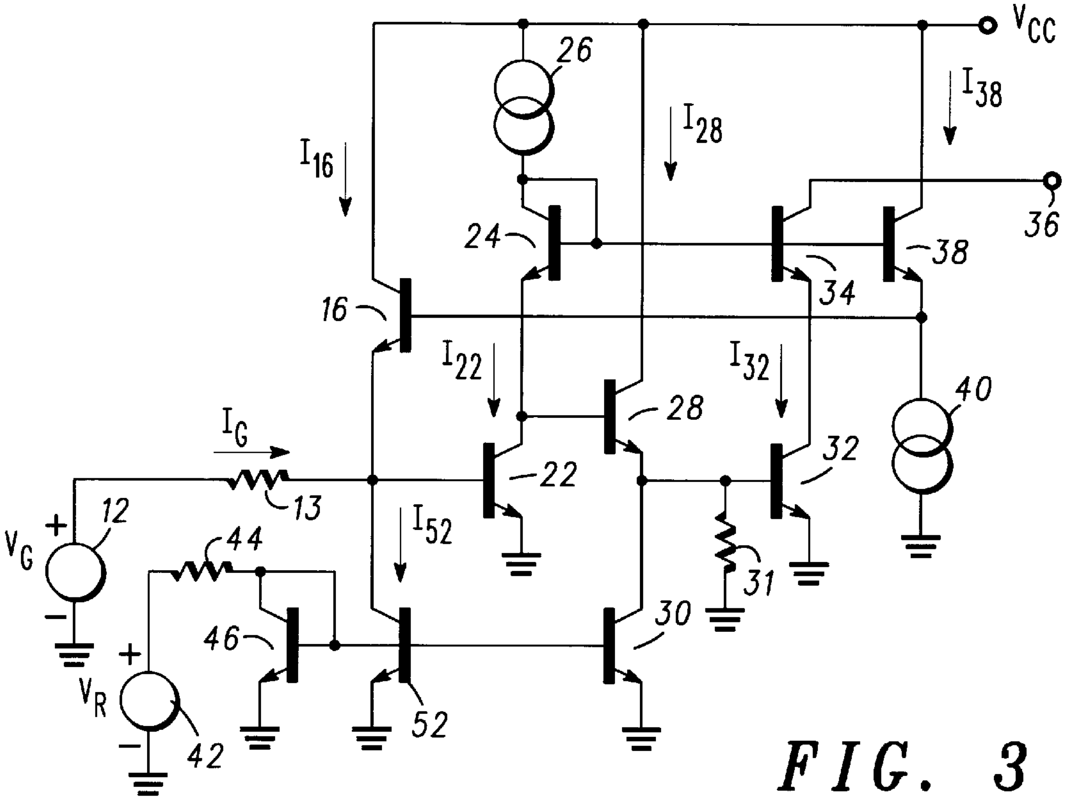
FIG. 3 is a circuit diagram of still another embodiment of the temperature compensation circuit.

FIG. 3 illustrates another embodiment of the temperature compensation circuit. It should be pointed out that like elements in the figures are denoted by the same reference numerals. The temperature compensation circuit receives a control voltage $V_G$ from a voltage source 12. A microprocessor, microcontroller, or other device capable of producing a variable voltage may supply the voltage $V_G$. Alternatively, the voltage $V_G$ may be generated on the same integrated circuit as the temperature compensation circuit. The voltage $V_G$ received at one terminal of resistor 13 is converted to a current $I_G$. The other terminal of resistor 13 is commonly connected to the emitter of transistor 16, a collector of a transistor 52, and a base of transistor 22. A reference voltage generator 42 is connected to one terminal of a resistor 44. The other terminal of resistor 44 is connected to the base and collector of a transistor 46, and to the base of transistors 52 and 30. The emitters of transistors 46, 52 and 30 are connected to the power conductor that receives a ground potential. In this embodiment, a resistor 31 connects the power conductor that receives a ground potential to the common connection that includes the emitter of transistor 28, the base of transistor 32, and the collector of transistor 30. In the preferred embodiment, resistors 13, 31, and 44 have matching resistance values.

Equations 4, 5, 6 and 7 set forth above are applicable to the embodiment of the temperature compensation circuit illustrated in FIG. 3. This embodiment of the temperature compensation circuit produces a temperature compensated output current at terminal 36 that is a function of the variable input current $I_G$, but with a different temperature coefficient. The temperature compensation circuit illustrated in FIG. 3 compares the input voltage $V_G$ to the reference voltage $V_R$ that is received having an unknown temperature coefficient and a current $I_{32}$ is supplied at output terminal 36 having a desired and known temperature coefficient.

By now it should be appreciated that a circuit is provided that receives a signal having a particular temperature coefficient and generates an output signal having a different temperature coefficient.

What is claimed is:

1. A temperature compensation circuit, comprising:

a first transistor having an emitter coupled to a first power conductor and a collector for conducting a temperature compensated output current;

a second transistor having an emitter directly connected to a base of the first transistor, an emitter coupled through a first current source to the first power conductor, and a collector coupled to a second power conductor;

a third transistor having a base and a collector coupled through a second current source to the second power conductor, and an emitter coupled to the base of the second transistor;

a fourth transistor having a base coupled to the base of the third transistor, an emitter coupled through a third current source to the first power conductor, and a collector coupled to the second power conductor;

a fifth transistor having a base coupled to the emitter of the fourth transistor, an emitter coupled through a fourth current source to the first power conductor, and a collector coupled to the second power conductor; and a sixth transistor having a base coupled to an emitter of the fifth transistor, a collector coupled to the emitter of the third transistor, and an emitter coupled to the first power conductor.

2. The temperature compensation circuit of claim 1, further comprising:

a seventh transistor having a collector coupled to the base of the sixth transistor and an emitter coupled to the first power conductor; and a eighth transistor having a base coupled to a base of the seventh transistor, a collector coupled to the base of the first transistor, and an emitter coupled to the first power conductor.

3. The temperature compensation circuit of claim 2, further comprising a first resistor that couples the base of the first transistor to the first power conductor.

4. The temperature compensation circuit of claim 3, further comprising a second resistor having a first terminal coupled for receiving a signal and a second terminal coupled to the base of the sixth transistor.

5. The temperature compensation circuit of claim 4, further comprising:

a third resistor having a first terminal coupled for receiving a reference signal; and a ninth transistor having a commonly coupled collector and base coupled to a second terminal of the third resistor and further coupled to the base of the seventh and eighth transistors.

6. The temperature compensation circuit of claim 5, further comprising a tenth transistor having a base coupled to the base of the third transistor, a collector coupled to the output terminal, and an emitter coupled to the collector of the first transistor.

* * * * *